(12) United States Patent
Lin

(10) Patent No.: US 6,599,680 B2
(45) Date of Patent: Jul. 29, 2003

(54) METHOD FOR FORMING CELLS ARRAY OF MASK READ ONLY MEMORY

(75) Inventor: Chun-Jung Lin, Hsin-Chu (TW)

(73) Assignee: Macronix International Co., LTD (TW)

( * ) Notice: Subject to any disclaimer, the term of this patent is extended or adjusted under 35 U.S.C. 154(b) by 135 days.

(21) Appl. No.: 09/811,392

(22) Filed: Mar. 20, 2001

(65) Prior Publication Data

US 2002/0136989 A1 Sep. 26, 2002

(51) Int. Cl.[7] .................................................. G03F 7/00
(52) U.S. Cl. ....................... 430/314; 430/311; 430/312; 430/313; 430/316; 430/317; 430/318
(58) Field of Search ................................ 430/311, 312, 430/313, 314, 316, 317, 318

(56) References Cited

U.S. PATENT DOCUMENTS

| | | | | | |
|---|---|---|---|---|---|
| 5,635,333 A | * | 6/1997 | Petersen et al. | ............ | 430/311 |
| 5,960,287 A | * | 9/1999 | Kunitou | ....................... | 438/275 |
| 6,221,718 B1 | * | 4/2001 | Hong | .......................... | 438/264 |
| 2002/0136048 A1 | * | 9/2002 | Lin | .............................. | 365/103 |
| 2002/0136989 A1 | * | 9/2002 | Lin | .............................. | 430/314 |

* cited by examiner

*Primary Examiner*—Mark F. Huff
*Assistant Examiner*—Nicole Barreca

(57) ABSTRACT

A method for forming cells array of mask read only memory, at least includes: form numerous gate structures on substrate; form numerous doped regions in uncovered part of substrate; form first conductor layer on uncovered part of substrate with a thickness essentially equal to thickness of gate structures; form first dielectric layer on first conductor layer; form second conductor layer on both gate structures and first dielectric layer; perform a pattern transform process for transferring both second conductor layer and gate structures into conductor lines as word lines; form second dielectric layer on sidewalls of conductor lines to form spacer; form code photoresist on second conductor layer; and perform ions implantation process for implant numerous ions into partial substrate which is not covered by code photoresist.

25 Claims, 8 Drawing Sheets

METHOD FOR FORMING CELLS ARRAY OF MASK READ ONLY MEMORY

BACKGROUND OF THE INVENTION

1. Field of the Invention

The present invention generally relates to a method for forming a cells array of mask read only memory (MROM), and relates to a method which reduces word line resistance and increases process window.

2. Description of the Prior Art

Essential configuration of cells array of conventional mask ROM is shown in FIG. 1 which is a top-view illustration. Numerous word lines 11 crisscross numerous bit lines 12, each word line 11 (bit line 12) is essentially parallel to and insulated to other word lines 11 (bit lines 12) 12. Moreover, one cell 13 of mask ROM is formed by both gate structure, where one word line 11 crosses one bit line 12, and surrounding space. Clearly, whether any cell 13 is opened or closed is decided by how threshold voltage of this cell 13 is adjusted in a code process. Further, in the code process, photoresist is used to cover part of cells which need not to adjust threshold voltage but to expose other part of cells which need to adjust threshold voltage in accordance with data to be stored, then an ion implantation process is performed to implant numerous ions into part of substrate which under gate structures should be adjusted corresponding threshold voltage.

However, owing to limitation of structure of cells 13 (or cells array), some defects of code process will is more serious while scale of mask ROM is continually decreased. Refers to FIG. 2A which is a cross sectional illustration along AA1 and omits both word line and dielectric layer for simplifying illustration, all sources and all drains are formed by numerous doped regions 22 in substrate 21, and gate structures 23 are located on substrate 21. Moreover, while cells array is programmed to store data, code photoresist 24 is used to control which cells are exposed and then ions 25 can be implanted into these uncovered cells, as FIG. 2B shows. Natural, whenever location of photoresist 24 is misaligned, as FIG. 2C shows, part of ions 26 will be implanted into cells that should be not be implanted for adjusting threshold voltage. Thus, because distance between adjacent gate structures is decreased as size of cells, or viewed ad critical dimension of MROM, is decreased, allowable misalignment of photoresist also is proportionally decreased. In other words, process window is decreased, then cost of corresponding fabrication is increased and quality of corresponding products is decreased.

Furthermore, because that lateral scatter of ions in the ions implantation process always is negligible, no matter it is induced by laterally incident ions 27, by scatters of ions induced by gate structure 23 or conductor line 24, or is induced by other unavoidable limitations of practical fabrication. It is indisputable that interference between neighboring cells always is negligible, except while scale of mask ROM cells is continually decreased. Besides, accompany with decrease of critical dimension of MROM, thickness of doped regions for forming both sources and drains also is proportionally decreased and an unavoidable defect is that resistance of doped regions is increased.

Accordingly, conventional structure of cells of mask ROM can not avoid some defects that are more and more serious while scale of cells is continually decreased. Thus, it is desired to develop a new method for forming mask ROM cell to improve fabrication of cells MROM and let MROM can be properly applied in the deep-submicron devices.

SUMMARY OF THE INVENTION

One primary object of the invention is to provide a method for forming cells array of mask read only memory ROM.

Another object of the invention is to provide a method for decreasing word line resistance and increasing process window during fabrication of MROM.

Still an object of the invention is to provide a cells array of MROM, which is suitable for deep-submicron products, without obvious modification of conventional fabrication of MROM.

Essential flow of the invention at least includes: form numerous gate structures on substrate; form numerous doped regions in uncovered part of substrate; form first conductor layer on uncovered part of substrate with a thickness essentially equal to thickness of gate structures; form first dielectric layer on first conductor layer; form second conductor layer on both gate structures and first dielectric layer; perform a pattern transform process for transferring both second conductor layer and gate structures into conductor lines as word lines; form second dielectric layer on sidewalls of conductor lines to form spacer; form code photoresist on second conductor layer; and perform ions implantation process for implant numerous ions into partial substrate which is not covered by code photoresist.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Aims at previous defects of conventional cells array of mask ROM, especially defects that are more and more serious while scale is continually decreased, Applicant of this invention provides some clues. First, interference between neighboring cells during the ions implantation process is induced by the fact that ions are improperly implanted into part of substrate which should not be implanted to modify corresponding threshold voltage. Moreover, it can be effectively improved by properly modify gate structure, and neighboring structure(s), to enhance the ability of preventing ions propagating, without modification of ions implantation process and/or configuration of cells array of MROM to prevent lateral scatter, also without precisely controlling ions implantation process to let code photoresist also properly cover proper cells. Second, both sources and drains need not be totally located in substrate. Because resistance is inversely proportional to physical scale, even thickness of doped regions is decreased in accompany with decreased of critical dimension of MROM, it is possible to prevent increase of resistance of sources (drains) by forming equivalent sources (equivalent drain) with both doped regions and conductor layers which overly doped regions, especially by increasing height but not cross area of conductor layers.

Figure 1:
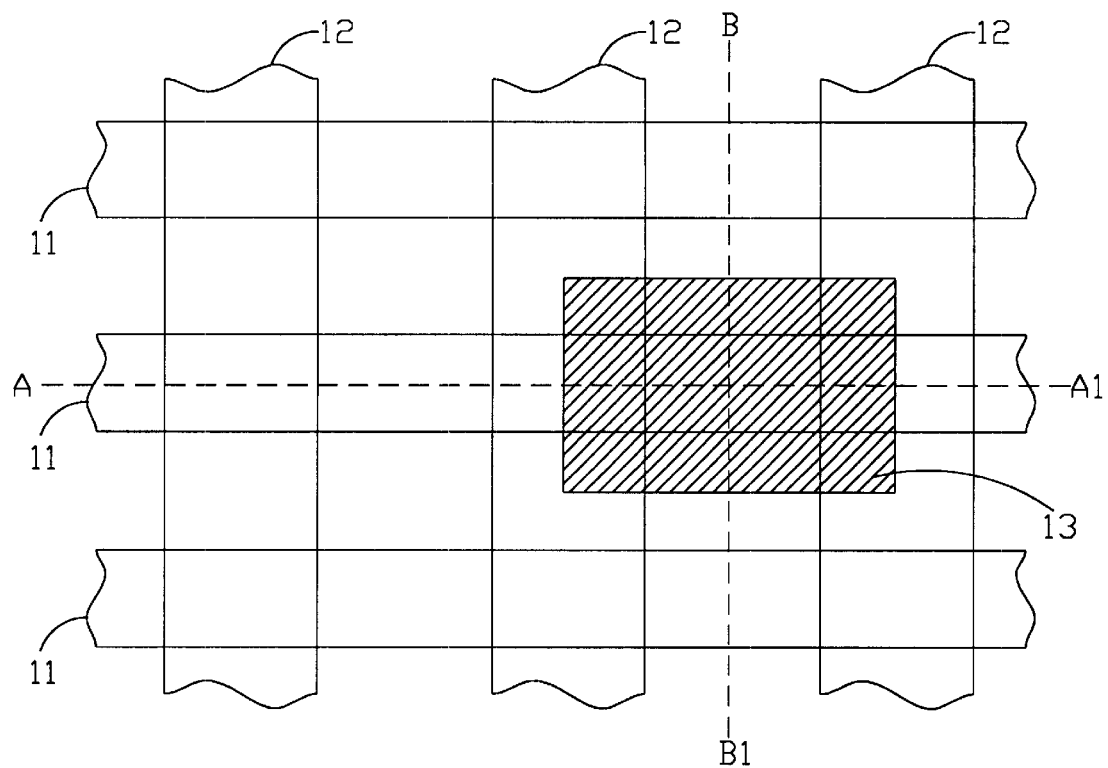
FIG. 1 is a top-view illustration of essential configuration of cells array of conventional mask ROM.
Figure 2A:
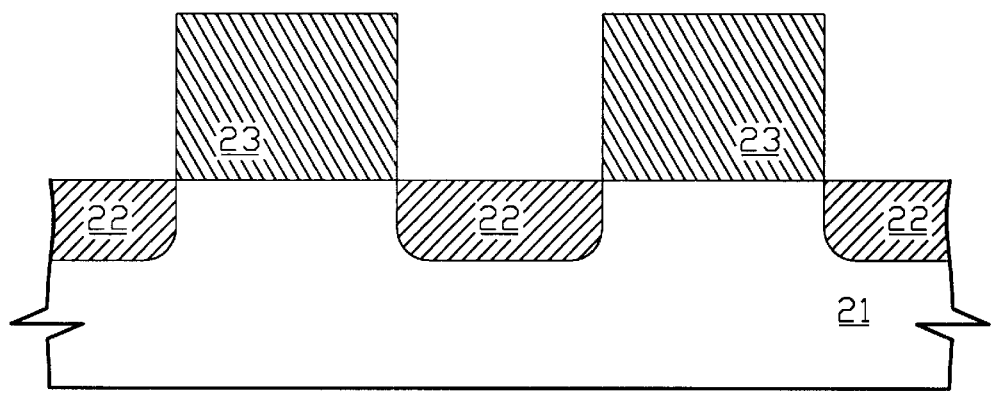
FIG. 2A through FIG. 2C are some cross sectional illustrations about essential structure of conventional cells array and often-seen defects of ions implantation process.
Figure 2B:
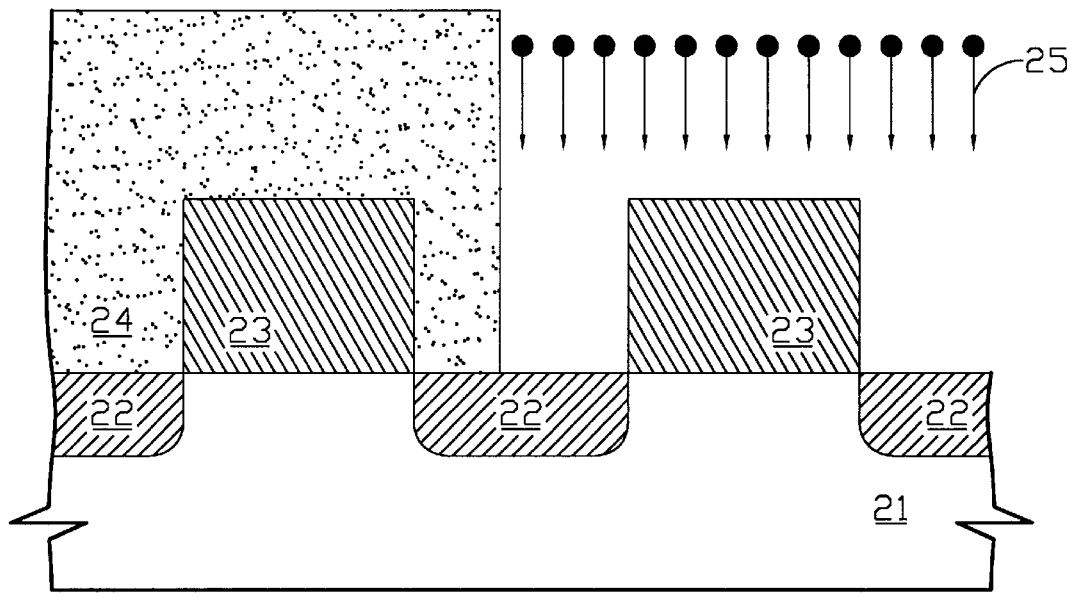
Figure 2C:
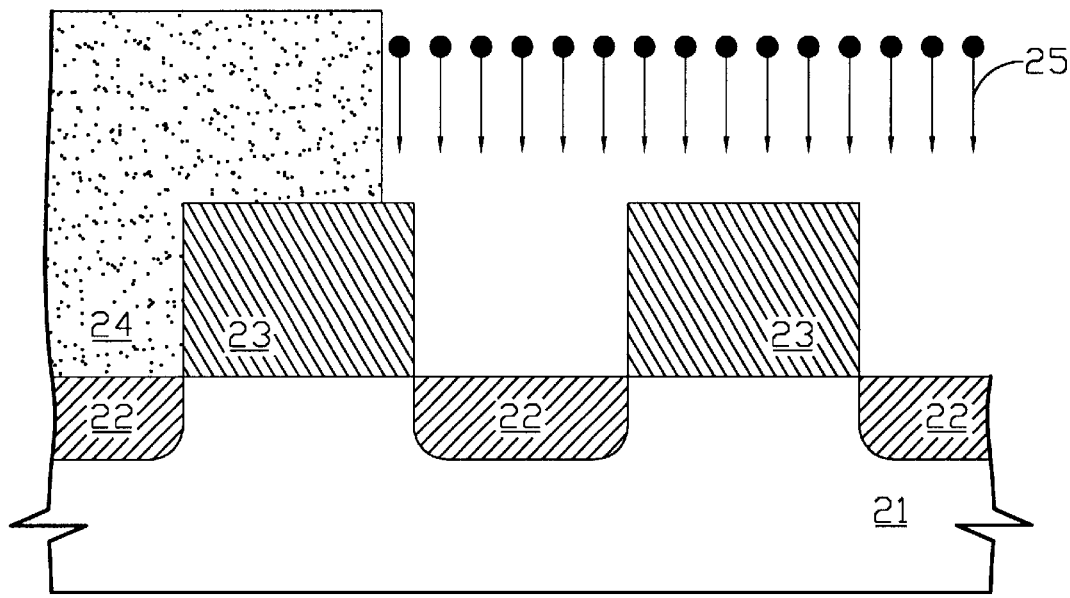

According to previous clues, the Applicant present a solution for improving, even thoroughly eliminating, previous defects: configuration of cells array is similar to well-know mask ROM, which means that top-view illustration still is as FIG. 1 shows; but for each cell, polysilicon structures, such as polysilicon plug, are located on doped regions to let each source (drain) is a combination of one polysilicon structure and one doped region, and then low resistance can be maintained even doped regions are shallow junctions. Besides, because MROM is programmed after cells array is formed and ions implantation process is used to program this cells array, polysilicon structures over doped regions, around gate structures, can obstruct propagation of ions and decrease the probability that ions are implanted into some cells which should not be implanted. Surely, height of polysilicon structures usually is briefly similar to height of gate structures.

Figure 3A:
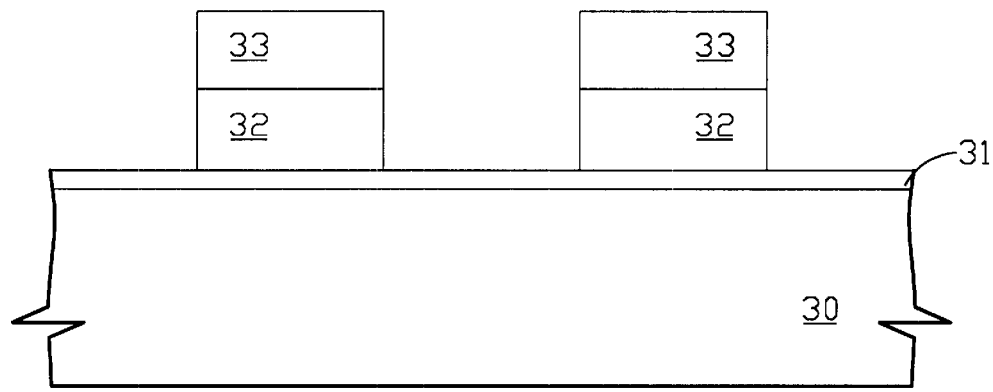
FIG. 3A through FIG. 3J are a series of cross-sectional illustrations about essential steps of one preferred embodiment of the invention.

One preferred embodiment of this present invention is a method for forming cells array of MROM, at least includes following essential steps:

Refers to FIG. 3A which is a cross sectional illustration along AA1, first dielectric layer 31, first polysilicon layer 32 and second dielectric layer 33 are formed in substrate 30 in sequence, then first pattern transform process is performed to remove part of second dielectric layer 33 and part of first polysilicon layer 32, by using first dielectric layer as etch stop layer, such that numerous gate structures are formed on substrate 30. At this time, because doped regions, for forming sources and drains, will be formed in part of substrate 30, which is not covered by gate structures, whole substrate 30 is covered in the cross sectional illustration along BB1.

Figure 3B:
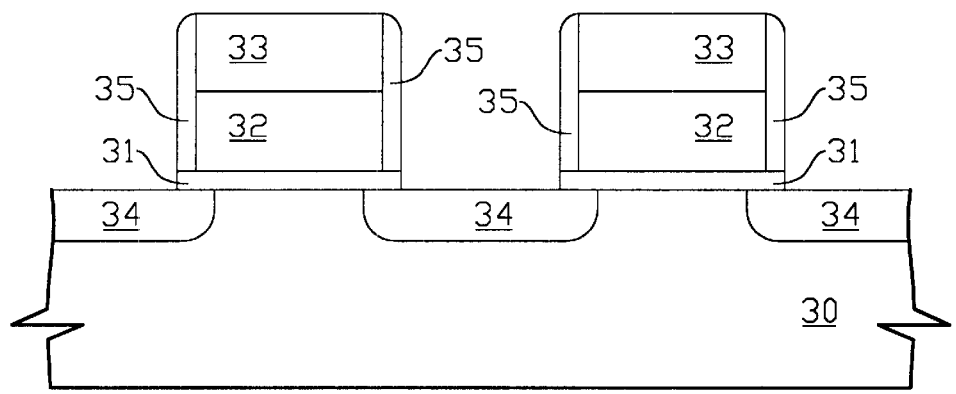

Refers to FIG. 3B which is a cross sectional illustration along AA1, uses gate structures as mask to implant numerous ions into substrate 30 for forming numerous doped regions 34, then forms numerous spacers on sidewalls of these gate structures such that sidewall of all gate structures are surrounded by spacers 35. However, forming order of doped regions 34 and spacers 35 is exchangeable. Further, because spacers 35 and doped regions 34 are formed around gate structures, the cross sectional illustration along BB1 also only appears substrate 30 covered by first dielectric layer 31, first polysilicon layer 32 and second dielectric layer 33.

Figure 3C:
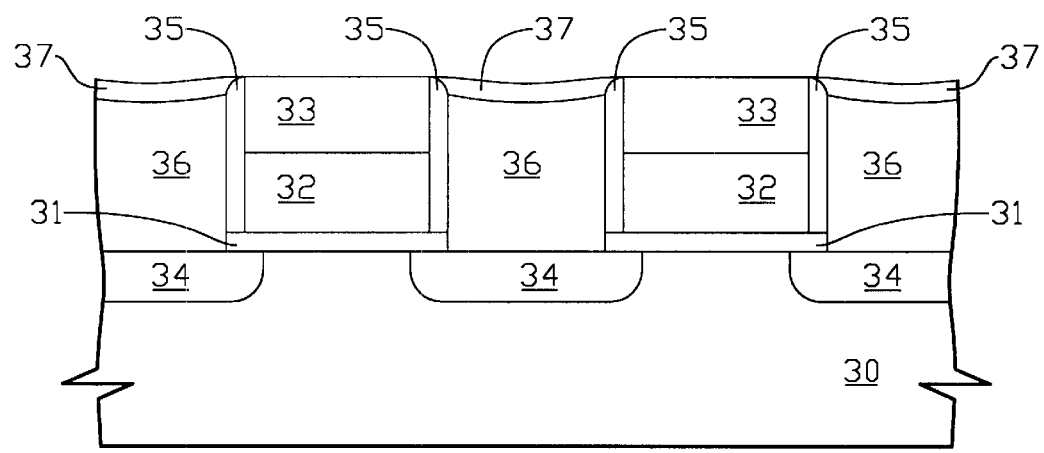

Refers to FIG. 3C which is a cross sectional illustration along AA1, forms second polysilicon layer 36 on substrate 30, where second polysilicon layer 36 covers partial substrate 30, which is not covered by gate structure or spacers 35, but essentially never covers any gate structure. Then, treats second polysilicon layer 36 by an oxidation process to form silicon oxide layer 37 on surface of second polysilicon layer 36. Again, because only gaps between neighboring gate structures are treated, the cross sectional illustration along BB1 still only appears substrate 30 covered by first dielectric layer 31, first polysilicon layer 32 and second dielectric layer 33. In addition, whenever resistance of conductor lines, such as bit lines, is not key factor of MROM, second polysilicon layer 36 and silicon oxide layer 37 can be replaced by spacer 35. In other words, steps shown in both FIG. 3B and Gig. 3C can be replaced by following steps in sequence: forms doped regions on substrate 30, forms material of spacer 35 m such as silicon oxide, on substrate 30, removes part of previous material until second dielectric layer 33 is exposed, which means that gaps between gate structures are fully filled by this material. Obviously, in this case, second polysilicon layer 36 is totally replaced by spacer 35 in FIG. 3C.

Figure 3D:
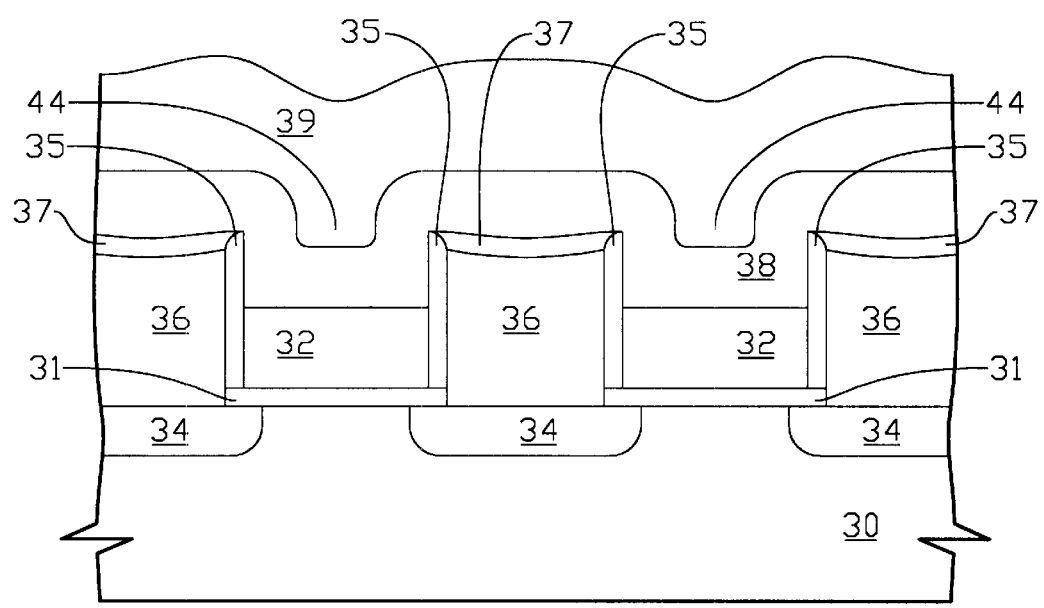

Refers to FIG. 3D which is a cross sectional illustration along AA1, removes second dielectric layer 33, then forms third polysilicon layer 38 on substrate 30, and then forms third dielectric layer 39 on third polysilicon layer 38. Herein, third polysilicon layer 38 conformally covers silicon layer 37, spacer 35 and residual first polysilicon layer 32, but third polysilicon layer 38 is insulated from second polysilicon layer 37 by silicon oxide layer 37.

Figure 3E:
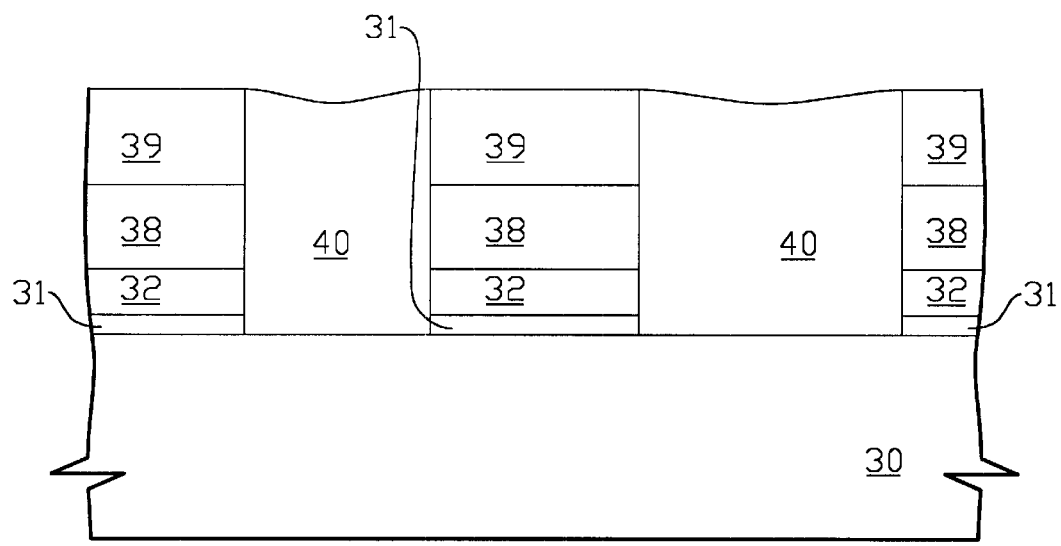

Refers to FIG. 3E which is a cross sectional illustration along BB1, perform second pattern transform process such that both third polysilicon layer 38 and residual first polysilicon layer are transferred into numerous conductor lines, which can be used as word lines, then forms fourth dielectric layer 40 on exposed substrate 30 which is not covered by residual first polysilicon layer 31, second polysilicon layer 36 or spacers 35. In this stage, because only conductor lines are formed and conductor lines are insulated by dielectric layer, the cross sectional illustration along AA1 is not changed, still is as FIG. 3D shows.

Additional, thickness of fourth dielectric layer 40 is essentially equal to summation of following: thickness of first polysilicon layer 32, thickness of third polysilicon layer 38 and thickness of third dielectric layer 39. Moreover, material of fourth dielectric layer 40 usually is good conformal dielectric, and both third polysilicon layer 38 and first polysilicon layer 32 also can be used to form gate structures of transistor in periphery.

Further, after fourth dielectric layer 40 is formed, an optional step is that forms sources and drains of transistors in periphery, then performs an additional thermal process with a temperature about 800° C. and a period about 30 seconds.

Figure 3F:
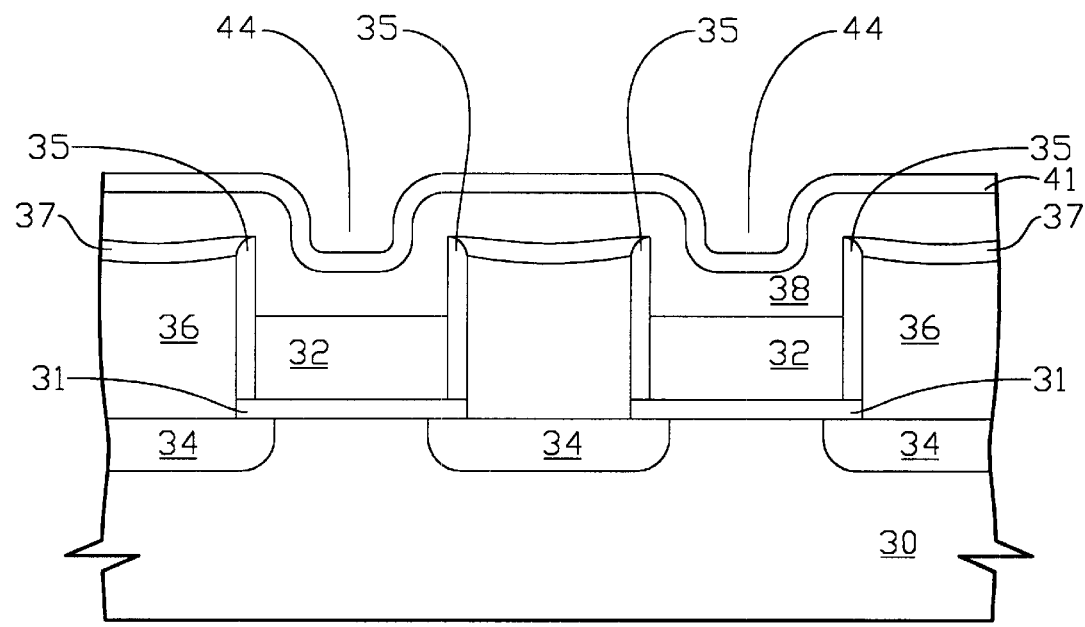

Refer to FIG. 3F which is a cross sectional illustration along AA1, removes third dielectric layer 39 and then forms metal silicide layer 41 on third polysilicon layer 38. Where, available materials of metal silicide 41 at least includes TiSi2, CoSi2, WSi2, PtSi2, MoSi2, PdSi2 and TaSi2, and an optional step is that removes unreacted metal, material for forming metal silicide 41, after metal silicide 41 is formed. Certainly, because third dielectric layer 39 also is shown in FIG. 3E and metal silicide 41 can be formed on any polysilicon, the cross sectional illustration along BB 1 also will show disappear of third dielectric layer 39 and appear of metal silicide layer 41, even it is not shown in figures.

Figure 3G:
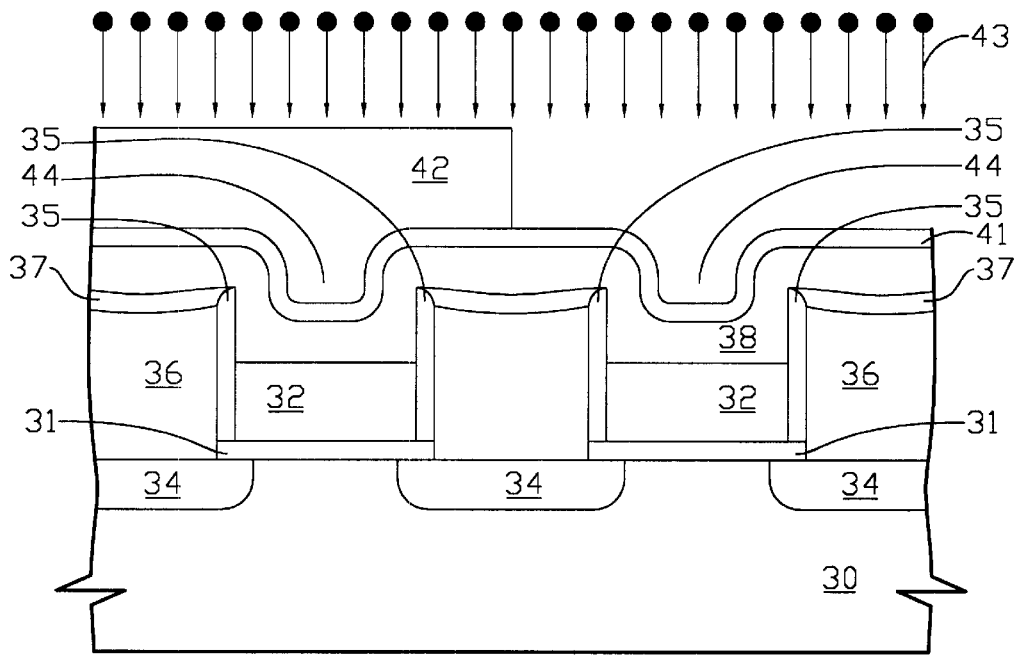

Refer to Fig. 3G which is a cross sectional illustration along AA1, forms code photoresist 42 over substrate 30, where code photoresist 42 covers part of residual first polysilicon layer 32, and then implants numerous ions 43, such as boron ions, phosphorous ions indium ions, and arsenic ions, into part of substrate 30 which is not covered by code photoresist 42, finally, removes code photoresist 42.

Emphasizes that because code photoresist 42 should cover all cells which threshold voltage is not desired to be adjusted, but ions 43 are implanted through all substrate 30, the cross sectional illustration along BB1 also presents equivalent relation between code photoresist 42 and ions 43: after third dielectric layer 39 is removed, height of fourth dielectric layer 40 is larger then height of neighboring conductor lines. Thus, during implantation of ions 43, fourth dielectric layer 40, which can obstruct propagation of ions 43, can effectively decrease the probability that ions 43 are implanted into some cells, which should not be implanted, by factors such as lateral scatter of ions 43 and mis-alignment of code photoresist 42.

Some practical values is provided as an example: first dielectric layer usually is silicon dioxide layer formed by thermal oxidation process and thickness is about 40 angstroms; material of first polysilicon layer 32 usually is undoped polysilicon or doped polysilicon, and thickness is about 500 angstroms; material of second dielectric layer 33 usually is silicide nitride and thickness is about 1000 angstroms; thickness of doped regions 34 usually is about less than 2000 angstroms, and each doped region 34 could further comprises a pocket; material of spacer 36 usually is silicon dioxide and typical width is about 200 angstroms; thickness of second polysilicon layer 36 usually is about 1300 angstroms and material usually is doped polysilicon; thickness of silicon oxide layer 37 usually is about 50 angstroms; thickness of third polysilicon layer 38 is about 500 angstroms and material is chosen from the group consisting of undoped polysilicon and N-type doped polysilicon; thickness of third dielectric layer 39 is about 600 angstroms and material usually is silicon nitride; thickness of fourth dielectric layer usually is about 1500 angstroms and material usually is good conformal dielectric, such as silicon dioxide; and implanted energy of ions 43 is about 45 KeV.

Significantly, as shown in FIG. 3D, this present method can let both doped regions 34 and second polysilicon layer 36 behave as equivalent sources (equivalent drains). Thus, even doped regions 34 is thin, existence of second polysilicon layer 36 prevent proportional increase of resistance.

Figure 3H:
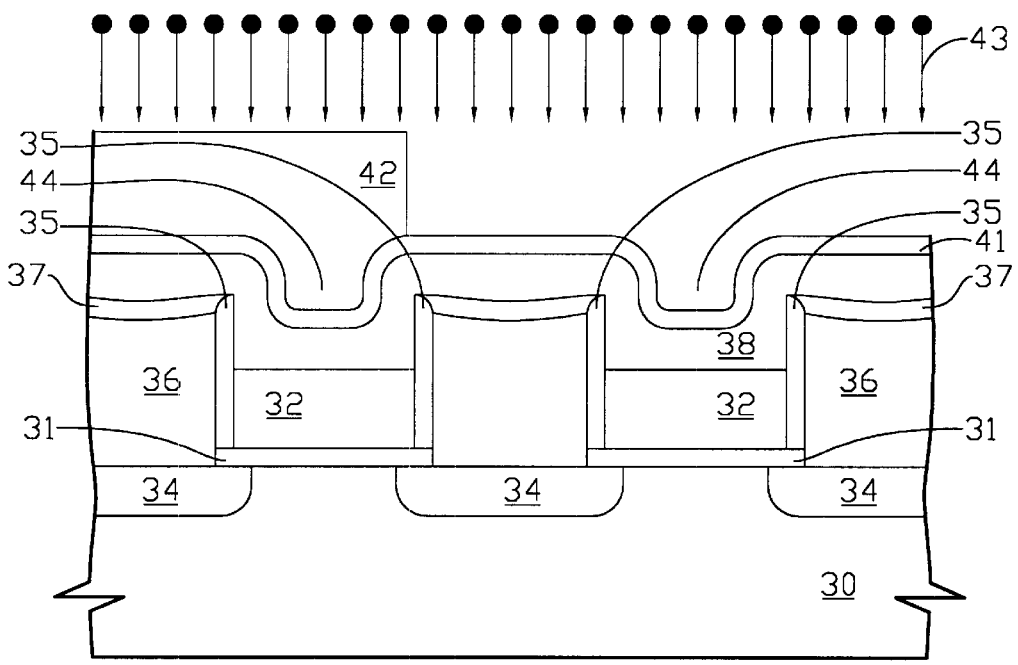

Besides, by referring to FIG. 3G and FIG. 3H, because that neighboring gate structures (combination of first dielectric layer 31, first polysilicon layer 32 and part of third polysilicon layer 38 which between neighboring spacers 35) are separated by second polysilicon layer 36, silicon oxide layer 36, part of third polysilicon layer 39 and part of metal silicide layer 41. It is reasonably that even lateral scatter happens, or strongly happens, or mis-alignment of code photoresist 42 is negligible as FIG. 3H shows, ions 43 still in hardly implanted into some cells where threshold should not be adjusted, and then interference from neighboring cells is effectively reduced or even eliminated.

Figure 3I:
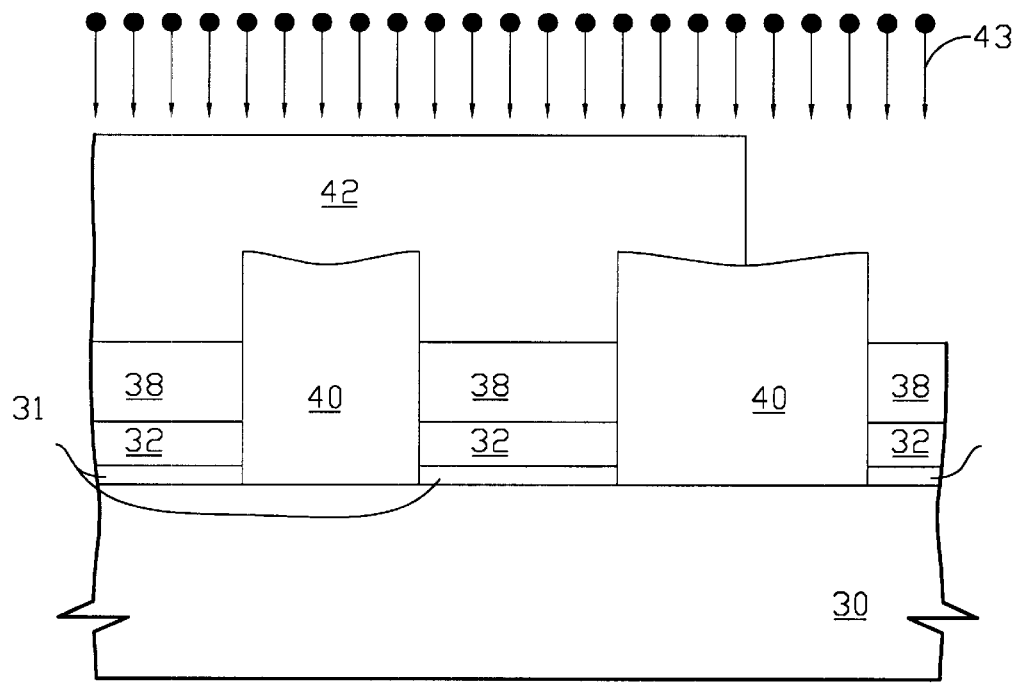
Figure 3J:
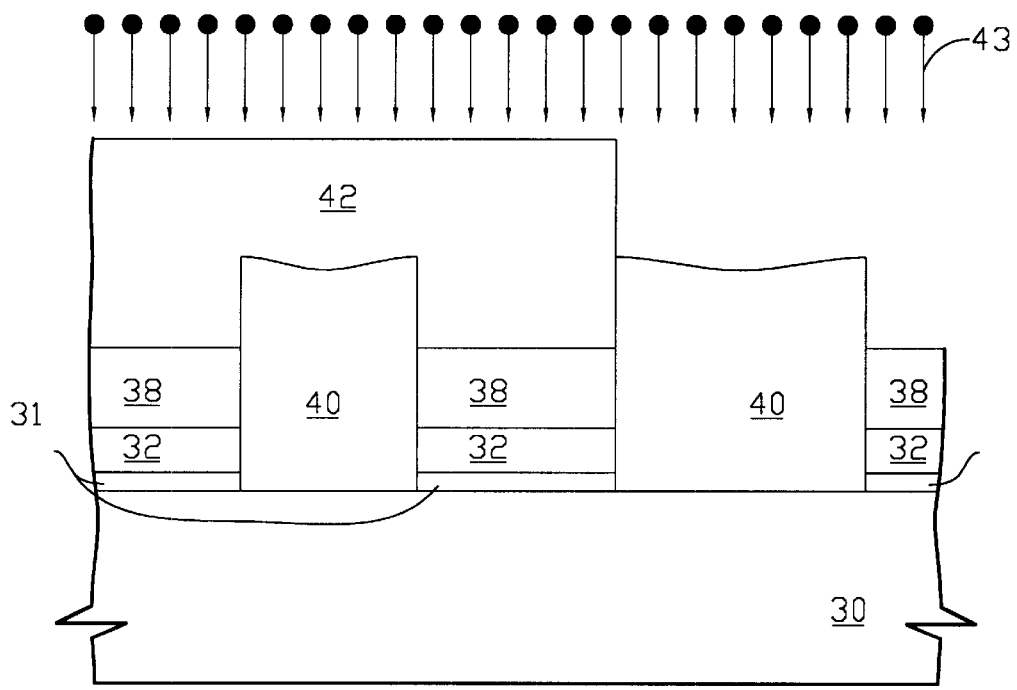

In comparison, by referring to FIG. 3I and FIG. 3J, after third dielectric layer 39 is removed, fourth dielectric layer 40 locate between adjacent gate structures, which are formed by first dielectric layer 31, first polysilicon layer 32 and third polysilicon layer 38, and height of fourth dielectric layer 40 is larger than height of adjacent gate structures. Thus, even lateral scatter happens, or strongly happens, or mis-alignment of code photoresist 42 is negligible as FIG. 3J shows, ions 43 still in hardly implanted into some cells where threshold should not be adjusted, and then interference from neighboring cells is effectively reduced or even eliminated.

Furthermore, because that polysilicon has excellent step coverage and metal silicide can be conformally formed on polysilicon, as FIG. 3F and FIG. 3F show, hollows 44 appear over first polysilicon layer 42. Significantly, because hollow 44 can reduce distance that ions 43 should be propagated through before ions 43 are implanted into underlying structure 30, existence of hollow 44 can reduce required energy of implanted ions 43 and then further reduce probability that ions implanted into neighboring cells. In other words, hollow 44 provides function of self-align.

Accordingly, this method could allow larger misalignment of code photoresist 42 than conventional skills, and then process window of fabrication of MROM is increased. Further, because interference between neighboring cells, especially hollows 44 increases proper implantation of ions 44, this method also provides self-align function, which means implanted position of ions 43 not only depends on location of code photoresist but also depends on shape and material of structures over substrate 30, in both word line direction and bit line direction, which is clear by referring to FIG. 3G through FIG. 3J.

Certainly, because silicon oxide layer 37 is used to insulate third polysilicon layer 38 from second polysilicon 36, silicon oxide layer 37 could be replaced by any dielectric layer. Moreover, because reflection in application of code photoresist 42 is more serious while scale of MROM is decreased, this method comprises following optional steps: forms anti-reflection coating (ARC) layer, such as silicon nitride layer with 1000 angstroms thickness, on metal silicide layer 41, forms code photoresist 42 on ARC layer, dry etch ARC layer by using code photoresist 42 as mask, and then implant ions 43 into substrate 30.

Figure 4:
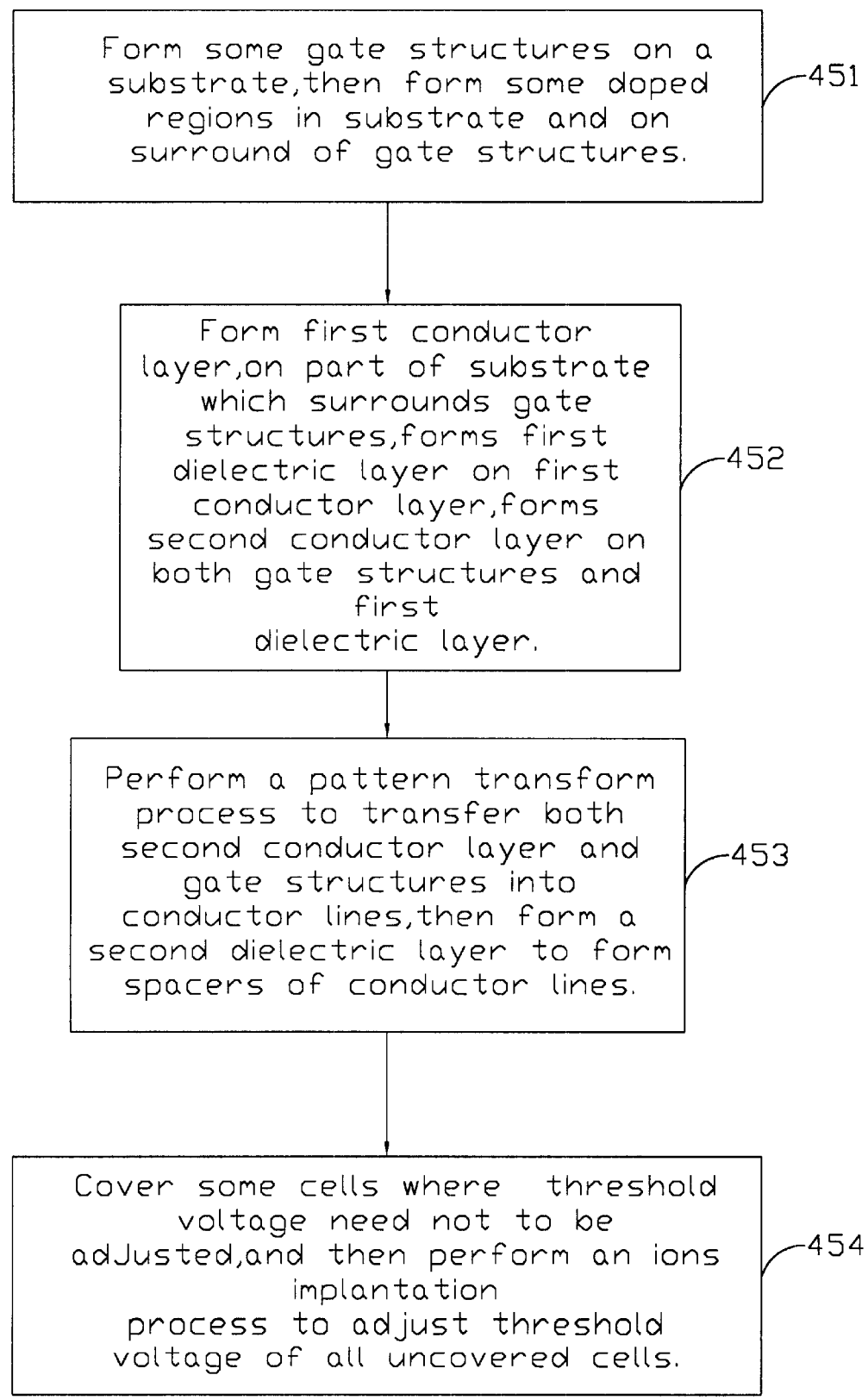
FIG. 4 is an essential flow chart of this invention.

As a summary, this method can be generalized as following essential steps as FIG. 4 shows, wherein preceding three steps is a method forming cells of MROM.

As transistor structure block 451 shows, form some gate structures on a substrate, and then form some doped regions in substrate and on surround of gate structures.

As prepare conductor line block 452 shows, form first conductor layer, where thickness of first conductor layer is essentially equal to thickness of gate structures, on part of substrate which surrounds gate structures, forms first dielectric layer on first conductor layer, forms second conductor layer on both gate structures and first dielectric layer.

As form conductor line 453 shows, perform a pattern transform process to transfer both second conductor layer and gate structures into conductor lines, and then form a second dielectric layer on the sidewall of conductor lines to form spacers of conductor lines.

As code block 454 shows, cover some cells where threshold voltage need not to be adjusted, and then perform an ions implantation process to adjust threshold voltage of all uncovered cells.

Although specific embodiments have been illustrated and described, it will be obvious to those skilled in the art that various modifications may be made without departing from what is intended to be limited solely by the appended claims.

What is claimed is:

1. A method for forming a cells array of mask read only memory, comprising:

forming a first dielectric layer on a substrate;

forming a first polysilicon layer on said first dielectric layer;

forming a second dielectric layer on said first polysilicon layer;

performing a first pattern transform process, wherein said first dielectric layer is used as an etch stop layer, part of said second dielectric layer and part of said first polysilicon layer being removed to form a plurality of gate structures;

doping by using said gate structures as a mask to form a plurality of doped regions in said substrate and then forming a plurality of spacers on the sidewalls of said gate structures, such that the sidewall of each said gate structure is surrounded by one said spacer, wherein forming order of said doped regions and said spacers are exchangeable;

forming a second polysilicon layer on said substrate, said second polysilicon layer covering the exposed part of said substrate which is not covered by said gate structures or said spacers, wherein said gate structures are not covered by said second polysilicon layer;

treating said second polysilicon by an oxidation process such that a silicon oxide layer is formed on said second polysilicon layer;

removing said second dielectric layer;

forming a third polysilicon layer over said substrate, said third polysilicon layer conformally covering said silicon oxide layer, said spacers and residual said first polysilicon layers;

forming a third dielectric layer on said third polysilicon layer;

performing a second pattern transform process, such that said third polysilicon layer and residual said first polysilicon layer are transferred into a plurality of conductor lines for word lines;

forming a fourth dielectric layer on part of said substrate that is not covered by residual said first polysilicon layer, said second polysilicon layer or said spacers, wherein thickness of said fourth dielectric layer is essentially equal to the summation of thickness of said first polysilicon layer, thickness of said third polysilicon layer and said third dielectric layer;

removing said third dielectric layer;

forming a metal silicide layer on said third polysilicon layer;

forming a code photoresist over said substrate, wherein said code photoresist covers part of residual said first polysilicon; and performing an ions implantation process, such that a plurality of ions are implanted into part of said substrate which is not under said code photoresist.

2. The method of claim 1, wherein said first dielectric layer is a silicide layer formed by a thermal oxidation process.

3. The method of claim 1, wherein thickness of said first dielectric layer is about 40 angstroms.

4. The method of claim 1, wherein material of said first polysilicon layer is chosen from the group consisting of undoped polysilicon and doped polysilicon.

5. The method of claim 1, wherein thickness of said first polysilicon layer is about 500 angstroms.

6. The method of claim 1, wherein material of said second dielectric layer is silicide nitride.

7. The method of claim 1, wherein thickness of said second dielectric layer is about 1000 angstroms.

8. The method of claim 1, wherein thickness of said doped regions is about less than 2000 angstroms.

9. The method of claim 1, wherein material of said spacer is silicon dioxide.

10. The method of claim 1, wherein width of each said spacer is about 200 angstroms.

11. The method of claim 1, wherein thickness of said second polysilicon layer is about 1300 angstroms.

12. The method of claim 1, wherein material of said second polysilicon layer is doped polysilicon.

13. The method of claim 1, wherein thickness of said silicon oxide layer is about 50 angstroms.

14. The method of claim 1, wherein thickness of said third polysilicon layer is about 500 angstroms.

15. The method of claim 1, wherein material of said third polysilicon layer is chosen from the group consisting of undoped polysilicon, doped polysilicon and N-type doped polysilicon.

16. The method of claim 1, wherein thickness of said third dielectric layer is about 600 angstroms.

17. The method of claim 1, wherein material of said third dielectric layer is silicon nitride.

18. The method of claim 1, wherein thickness of said fourth dielectric layer is about 1500 angstroms.

19. The method of claim 1, wherein material of said fourth dielectric layer is good conformal dielectric.

20. The method of claim 1, wherein material of said fourth dielectric layer is silicon dioxide.

21. The method of claim 1, wherein said metal suicide is chosen from the group consisting of TiSi2, CoSi2, WSi2, PtSi2, MoSi2, PdSi2 and TaSi2.

22. The method of claim 1, further comprise removing unreacted metal after said metal silicide is formed.

23. The method of claim 1, wherein said ions are chosen from the group consisting of boron ions, phosphorus ions, indium ions, and arsenic ions.

24. The method of claim 1, wherein implanted energy of said ions during said ions implantation process is about 45 KeV.

25. A method for forming a cells array of mask read only memory, comprising:

forming a first dielectric layer, a first polysilicon layer and a second dielectric layer on a substrate in sequence;

performing a first pattern transform process, wherein said first dielectric layer is used as an etch stop layer, part of said second dielectric layer and part of said first polysilicon layer being removed to form a plurality of gate structures;

using said gate structures as a mask to form a plurality of doped regions in said substrate;

forming a plurality of spacers on the sidewalls of said gate structures, such that said substrate is thoroughly covered by said doped regions and said spacers;

removing said second dielectric layer;

forming a second polysilicon layer on said substrate, said second polysilicon layer conformally covering said spacers and residual said first polysilicon layer;

forming a third polysilicon layer on said second polysilicon layer;

forming a third dielectric layer on said third polysilicon layer;

performing a second pattern transform process, such that said second polysilicon layer and residual said first polysilicon layer are transferred into a plurality of conductor lines for word lines;

forming a fourth dielectric layer on the sidewalls of said conductor lines, wherein thickness of said fourth dielectric layer is essentially equal to the summation of thickness of said first polysilicon layer, thickness of said second polysilicon layer and said third dielectric layer;

removing said third dielectric layer;

forming a metal silicide layer on said second polysilicon layer;

forming an anti-reflection layer on both said metal silicide layer and said fourth dielectric layer;

forming a code photoresist over said anti-reflection layer, wherein said code photoresist covers part of residual said first polysilicon;

removing part of said anti-reflection layer which is not covered by said anti-reflection layer, wherein both said metal silicide layer and said fourth dielectric layer is used as an etch stop layer;

performing an ions implantation process, such that a plurality of ions are implanted into part of said substrate which is not under said code photoresist; and removing said code photoresist.

* * * * *